United States Patent [19]

Belouet

[11] Patent Number: 5,376,622
[45] Date of Patent: Dec. 27, 1994

[54] METHOD OF MANUFACTURING AN INGOT OF A HIGH CRITICAL TEMPERATURE SUPERCONDUCTIVE OXIDE

[75] Inventor: Christian Belouet, Sceaux, France

[73] Assignee: Alcatel Alsthom Compagnie Generale d'Electricite, Paris Cedex, France

[21] Appl. No.: 40,596

[22] Filed: Mar. 31, 1993

[30] Foreign Application Priority Data

Apr. 6, 1992 [FR] France ................. 92 04174

[51] Int. Cl.$^5$ ............... H01B 12/00; H01L 39/12
[52] U.S. Cl. ...................... 505/451; 505/725;
505/742; 252/518; 252/521; 432/15; 432/58;
432/127; 75/639
[58] Field of Search ............ 505/1, 725, 742;
432/15, 58, 127, 128; 75/639; 252/518, 521

[56] References Cited

U.S. PATENT DOCUMENTS

| | | | |
|---|---|---|---|
| 4,546,811 | 10/1985 | Potard | 164/66.1 |
| 4,942,151 | 7/1990 | Capone | 505/1 |
| 4,975,411 | 12/1990 | Danby | 505/1 |

FOREIGN PATENT DOCUMENTS

| | | | |
|---|---|---|---|
| 0070760 | 1/1983 | European Pat. Off. | |
| 0423375 | 11/1990 | European Pat. Off. | 505/1 |
| 0474566 | 3/1992 | European Pat. Off. | |

OTHER PUBLICATIONS

Jin "Large magnetic hysteresis in a melt-textured Y-Ba-Cu-O . . . " *Appl. Phys. Lett* v. 54(6) Feb. 6, 1989 pp. 584-587.
Murakami "Microstructural Study of the Y-Ba-Cu-O . . ." *Jap Jnl Appl Phys.* vol. 28(3) Mar. 1989 pp. L399-L401.
Journal of Crystal Growth, vol. 100, No. 1/2, Feb. 1990, Amsterdam, Netherlands, pp. 286-292, Pinol et al.: "High temperature superconductor composites by a modified bridgman method".
Patent Abstracts of Japan, vol. 13, No. 419 (C-637) Sep. 18, 1989 & JP-A-11 57 499 (Toshiba Corp.) Jun. 20, 1989.

Primary Examiner—Paul Lieberman
Assistant Examiner—M. Kopec
Attorney, Agent, or Firm—Sughrue, Mion, Zinn, Macpeak & Seas

[57] ABSTRACT

A melting-and-solidification manufacturing method for manufacturing an ingot of a high critical temperature superconductive oxide belonging, in particular, to the YBaCuO, BiSrCaCuO, or TlBaCaCuO families, wherein:

an ingot of oxide having the appropriate stoichiometery is used;
the ingot is held horizontally by levitation on a film of gas inside a furnace;
the ingot is melted;
a vertical thermal gradient is established inside said furnace such that nucleation starts at the bottom portion of said ingot;
while maintaining said thermal gradient, the overall temperature of the furnace is lowered at a rate of not more than 0.1° C./hour down to the temperature which corresponds to complete ingot solidification; and
finally, conventional oxygenation treatment is applied to said ingot.

5 Claims, 2 Drawing Sheets

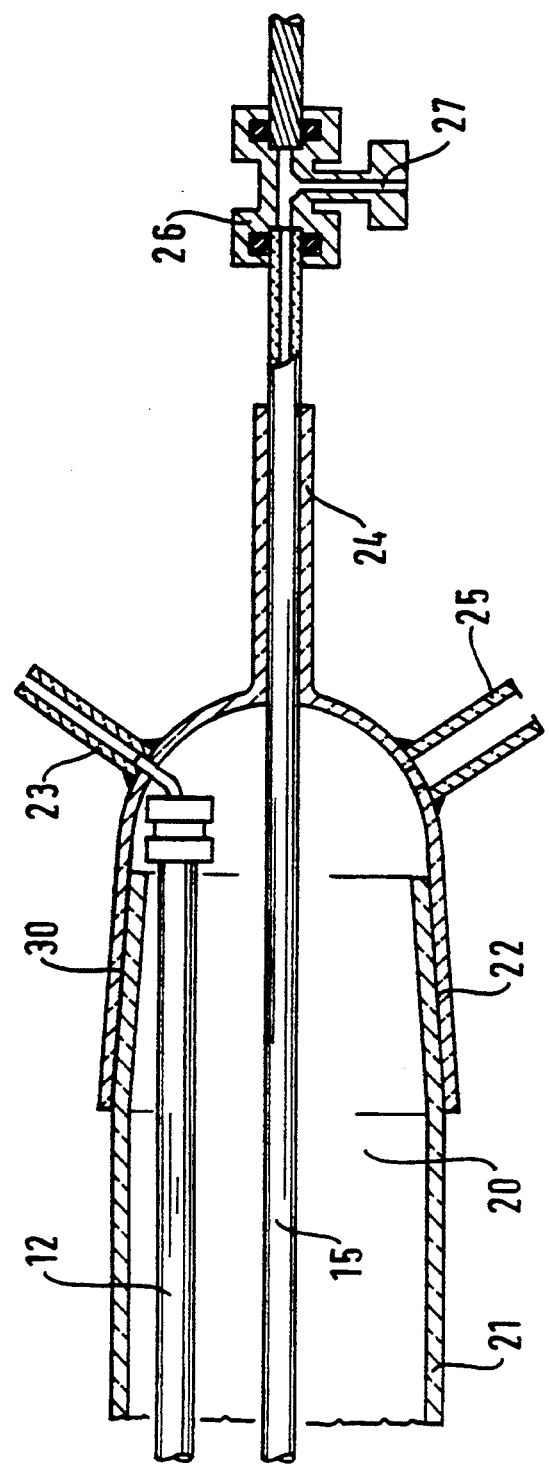

METHOD OF MANUFACTURING AN INGOT OF A HIGH CRITICAL TEMPERATURE SUPERCONDUCTIVE OXIDE

The present invention relates to a method of manufacturing an ingot of a high critical temperature superconductive oxide, in particular belonging to the YBaCuO, BiSrCaCuO, or TlBaCaCuO families.

BACKGROUND OF THE INVENTION

The principle of the method is a that of a peritectic-type growth method based on a two-phase medium, which method is usually performed in a crucible. Before solidification proper, that method requires high treatment temperatures, typically at least 50° C. higher than the peritectic solidification temperature $T_p$ of the oxide in question (e.g. 1,000° C. for YBaCuO). At such temperatures the superconductive oxide is decomposed into a solid (e.g. the solid 211 phase $Y_2BaCuO_5$ for $YBa_2Cu_3O_{7-x}$) and a liquid which might react with the walls of the crucible. This results in drift in the composition of the phase diagram.

Solidification is very slow, in particular, because the reaction involves two solid bodies and one liquid body; e.g. for YBaCuO:

$Y_2BaCuO_5$ + solid

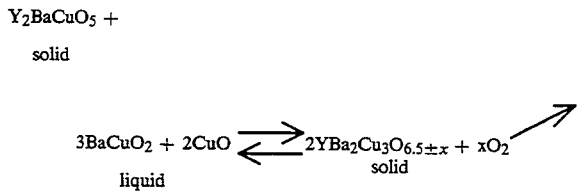

$3BaCuO_2 + 2CuO \rightleftarrows 2YBa_2Cu_3O_{6.5\pm x} + xO_2$
liquid   solid (where x=0.5).

Ideally, ingot growth should take place in the vicinity of the peritectic temperature $T_p$ with a small amount of supercooling; a large amount of supercooling would lead to solid particles being included in the growth front. Moreover, growth should take place uniformly, in a non-convective state, because local variations in supercooling would give rise to high instantaneous growth speeds, with the risk of solid particles being trapped in the growth front.

The ideal method of growing an ingot should therefore be a slow-growth diffusion method, but that would involve the liquid and the crucible being in contact with each other for very extended contact times at very high temperatures, with the damaging consequences that are described above: partial dissolution of the crucible, modification in the phase diagram, inclusion of parasitic phases, precipitates at grain boundaries, etc., the result being that the texturing of the final ingot is partially destroyed, and that large-size precipitates are present therein. In addition, cracks are formed due to the difference in the coefficients of expansion of the crucible and of the ingot, with the ingot sticking to the crucible.

All these adverse effects ultimately lead to a reduction in the critical current density $J_c$ and prevent large-size ingots, e.g. of about 50 cm³, from being made.

OBJECT AND BRIEF SUMMARY OF THE INVENTION

An object of the present invention is to provide a method of manufacturing an ingot of a high critical temperature superconductive oxide by melting-and-solidification, the method making it possible to obtain a crystal texture that is as close as possible to that of a monocrystal.

The present invention provides a melting-and-solidification manufacturing method for manufacturing an ingot of a high critical temperature superconductive oxide belonging, in particular, to the YBaCuO, BiSrCaCuO, or TlBaCaCuO families wherein:

an ingot of oxide having the appropriate stoichiometery is used;

the ingot is held horizontally by levitation on a film of gas inside a furnace;

the ingot is melted;

a vertical thermal gradient is established inside said furnace such that nucleation starts at the bottom portion of said ingot;

while maintaining said thermal gradient, the overall temperature of the furnace is lowered at a rate of not more than 0.1° C./hour down to the temperature which corresponds to complete ingot solidification; and finally, conventional oxygenation treatment is applied to said ingot.

In an advantageous embodiment, said vertical thermal gradient is about 10° C. per centimeter.

In an improved embodiment, the temperature of said bottom portion of the ingot is adjusted such that said nucleation starts at only one end of the ingot, and then grows slowly to reach the other end.

This intermediate stage may last several tens of hours for an ingot that is about ten centimeters long.

At the base of said ingot, a single texture is thus obtained, with continuous planes (a, b) between crystals.

During the period in which the temperature is gradually lowered while the vertical thermal gradient is maintained, growth takes place from the base texture in the vertical direction. During this entire solidification stage, the temperature of the growth interface remains very close to the peritectic temperature $T_p$.

Preferably, the levitation is performed via porous membranes made of magnesium oxide, the permeability of the membranes lying in the approximate range $1.10^{-15}$ m² to $2.10^{-15}$ m².

By being levirated on a film of gas, the ingot is self-supporting, thereby facilitating oxygen diffusion into the ingot from its outside surface.

Advantageously, the composition of the levitation gas may be adjusted to achieve said oxygenation treatment. For example, the gas may be pure oxygen from 600° C. for compounds in the YBaCuO family.

In an improved embodiment, a vertical magnetic field lying in the approximate range 1 tesla to 3 teslas is applied to the ingot while it is being melted and solidified. Such a magnetic field increases the apparent viscocity of the medium, and thus reduces any convection that may appear therein.

Since the method of the invention is contact-free, it makes it possible to avoid all the drawbacks due to the prior art crucible (composition drift, spontaneous and disordered nucleation-growth on the walls, thermomechanical stresses); the most major causes of fracturing are eliminated, and a uniform texture is obtained constituted by large-dimension grains, with a critical current density value that is close to that of a monocrystal.

BRIEF DESCRIPTION OF THE DRAWINGS

Other features and advantages of the present invention appear on reading the following description given by way of non-limiting example with reference to the accompanying drawings, in which:

FIG. 2 is a very diagrammatic fragmentary view in section through one end of the device shown in FIG. 1.

MORE DETAILED DESCRIPTION

Figure 1:
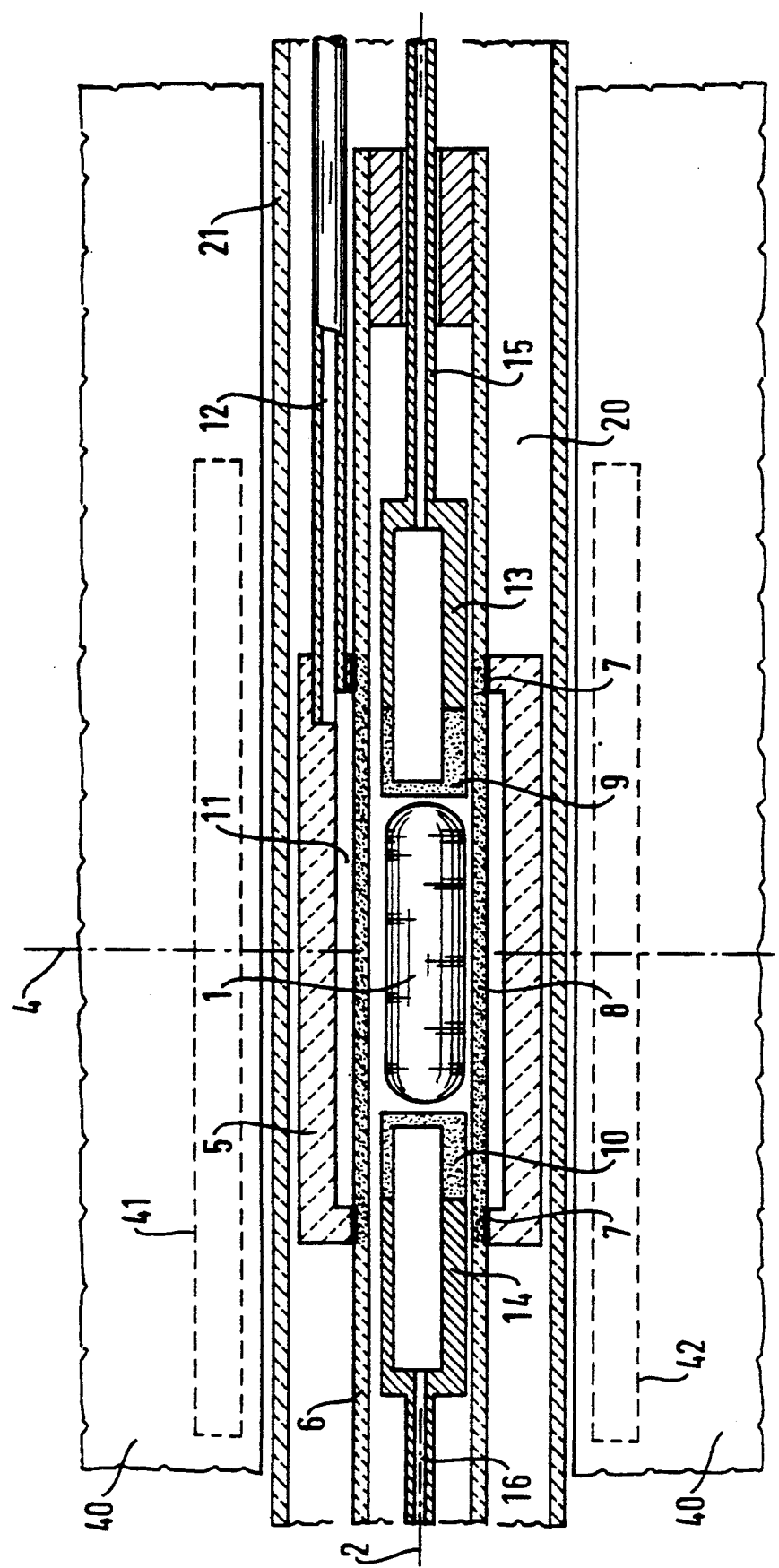
FIG. 1 is a very diagrammatic fragmentary view in section through the central portion of a device enabling the method of the invention to be performed.

FIG. 1 shows an ingot 1 obtained by isostatic pressing of a mixture in powder form of $BaCuO_2$, $CuO$, and $Y_2O_3$, in the stoichiometric proportions corresponding to $YBa_2Cu_3O_{7-x}$. The relative density of the ingot is high and preferably not less than 0.70. The mixture in powder form is sintered.

The dimensions of the ingot are as follows:
diameter $\leq 19.85$ mm; and
length: 50 mm;
(the length may be greater, e.g. at least 200 mm).

The ingot 1 is inserted into a levitation device made up principally of two coaxial portions whose axis is referenced 2, and having a plane of symmetry 4 that is orthogonal to the axis 2, the portions being an outer tube-shaped hollow body 5, and an inner tube 6. They are both made of ceramic and they are secured together by seals 7. The portion of tube 6 that is inside tube 5 constitutes a porous diffusion membrane 8 having an inside diameter of 20.0 mm and a length of not less than 400 mm. On either side of the membrane 8 proper, the inside diameter of the tube 6 is 20.5 mm (this difference is not visible in FIG. 1).

Preferably, the ceramic of which the membrane 8 is made is magnesium oxide which is wetted very little by the compounds of the ingot 1. The membrane 8 and tube 5 form a cavity 11 between them which is fed with levitation gas via a pipe 12.

Inside tube 6, two pistons 13 and 14 are disposed on either side of the ingot 1. Facing the ingot, the pistons are provided with respective diffusion membranes 9 and 10 which are of the same type as membrane 8, and which are fed with levitation gas via pipes provided inside sliding rods 15 and 16. The outside diameter of both pistons is chosen to be 19.85 mm.

The above-described assembly is disposed inside a gastight enclosure 20 constituted by a silica tube 21 closed at 30 by two caps 22, one of which is visible in FIG. 2.

The cap is equipped with various orifices 23, 24, 25. Orifice 23 enables membrane 8 to be fed with gas; orifice 25 enables the enclosure 20 to be evacuated; and orifice 24 serves both as a passage through which the rod 15 can move in translation, which rod is coupled to a motor (not shown) at 26, and also for feeding membrane 9 with gas (see reference 27).

Preferably, the levitation gas is mixture of argon and oxygen, e.g. respectively 80% and 20% by volume, but the proportion of oxygen may be increased.

The enclosure 20 is disposed in a tubular furnace 40 powered by cartridges 41, 42 disposed parallel to the axis 2, and inside a ceramic collar, e.g. made of stabilized zirconium oxide, having an inside diameter of 55 mm and an outside diameter 80 mm. The cartridges are disposed nonsymmetrically so as to create a temperature gradient between the bottom and the top of the ingot 1. The power of each cartridge must be adjustable so as to obtain a vertical gradient in the middle portion of the oven of 10° C./cm.

For example, the above-described installation is used as follows.

Firstly, the enclosure 20 is evacuated (orifice 25) so as to degas the ingot 1, and the ingot is heated to 600° C. without levitation.

The ingot 1 is then put into levitation by means of the membranes 8, 9, 10 whose diffusion pressure is controlled by any known means.

The ingot is then heated quickly to 1,050° C., the molten ingot being confined by the three membranes. By way of indication, the pressure downstream from the membranes is 700 mbars for an ingot height of less than 20 mm, and membrane permeability in the approximate range $1.10^{-15}$ $m^2$ to $2.10^{-15}$ $m^2$.

The temperature inside the furnace 40 is maintained uniformly at 1,050° C. for about fifteen minutes. Then the temperature is reduced to the peritectic temperature $T_p$, i.e. about 1,000° C.

By adjusting the heating cartridges 41 and 42, the temperature of the bottom cartridges is lowered, and a vertical temperature gradient of 10° C./cm is then imposed in the furnace, so that primary nucleation takes blase at the base of the ingot 1. But, a longitudinal thermal gradient is also created so that nucleation can start at only one end of the ingot, e.g. the end adjacent to membrane 9. For example, the longitudinal gradient is a few degrees per centimeter. The growth front extends very slowly to reach the other end of the ingot; this stage lasts a few tens of hours so that the base of the ingot is almost perfectly textured.

The overall furnace temperature is then lowered at a rate of less than 0.1° C. per hour until the ingot has completely solidified and thereafter. The temperature of the top surface of the ingot 1 is slightly less than $T_p$ at the end of this stage.

At 700° C., the oxidation process of the solid ingot 1 causes a relatively large expansion in volume. The ingot 1 must then be displaced by means of the pistons 13 and 14 out of the levitation region, i.e. out of membrane 8 to where the diameter of tube 6 is 20.5 mm.

The temperature continues to be lowered at 1° C./hour until ambient temperature is reached after dwelling for periods of several hours at 600° C., at 500° C. and at 400° C.

The resulting ingot is cylindrical in shape with its top portion being flattened. It is highly textured, with large grains whose c-axes are vertical and parallel to the axial midplane of the ingot.

Naturally, the invention is not limited to the above-described embodiment. Without going beyond the ambit of the invention, any of the means may be replaced with equivalent means.

What is claimed is:

1. A melting-and-solidification manufacturing method for manufacturing an ingot of a high critical temperature superconductive oxide belonging to the YBaCuO, BiSrCaCuO, or TlBaCaCuO families, wherein:
   an ingot of oxide having the appropriate stoichiometery is used;
   the ingot is held horizontally by levitation on a film of gas inside a furnace;
   the ingot is melted;
   a vertical thermal gradient is established inside said furnace such that nucleation starts at the bottom portion of said ingot the temperature of said bottom portion of said ingot is adjusted such that nucleation only at one end of the ingot and then grows slowly to reach the other end;

while maintaining said thermal gradient the overall temperature of the furnace is lowered at a rate of not more than 0.1° C./hour down to the temperature which corresponds to complete ingot solidification; and finally, conventional oxygenation treatment is applied to said ingot.

2. A manufacturing method according to claim 1, wherein said vertical thermal gradient is about 10° C. per centimeter.

3. A manufacturing method according to claim 1, wherein the levitation is performed via porous membranes made of magnesium oxide, the permeability of the membranes lying in the approximate range $1.10^{-15}$ m$^2$ to $2.10^{-15}$ m$^2$.

4. A method according to claim 1, wherein while the ingot is being melted and solidified, a vertical magnetic field lying in the approximate range 1 tesla to 3 teslas is applied to the ingot.

5. A method according to claim 1, wherein the levitation gas contains a mixture of argon and oxygen, with at least 20% of oxygen by volume.

* * * * *